United States Patent
Burry et al.

(10) Patent No.: US 8,208,118 B2
(45) Date of Patent: Jun. 26, 2012

(54) METHOD FOR DETERMINING EXPOSURE SETTINGS, LITHOGRAPHIC EXPOSURE APPARATUS, COMPUTER PROGRAM AND DATA CARRIER

(75) Inventors: David Warren Burry, Veldhoven (NL); Ralph Brinkhof, 's-Hertogenbosch (NL); Frank Staals, Eindhoven (NL); Robert Franken, Deurne (NL); Erik Johan Koop, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 672 days.

(21) Appl. No.: 12/367,191

(22) Filed: Feb. 6, 2009

(65) Prior Publication Data

US 2009/0201473 A1 Aug. 13, 2009

Related U.S. Application Data

(60) Provisional application No. 61/006,950, filed on Feb. 7, 2008.

(51) Int. Cl.
*G03B 27/68* (2006.01)

(52) U.S. Cl. ............ 355/52; 355/55; 355/67; 355/77

(58) Field of Classification Search .......... 355/30, 355/52, 53, 55, 67, 77; 250/492.2, 492.22, 250/548; 356/237, 399–401, 609, 620, 624
See application file for complete search history.

(56) References Cited

U.S. PATENT DOCUMENTS

| | | | |
|---|---|---|---|
| 6,674,510 B1 | 1/2004 | Jasper et al. | |
| 7,292,351 B2 | 11/2007 | Schoonewelle et al. | |
| 7,472,580 B2 | 1/2009 | Lyons et al. | |
| 2007/0181827 A1* | 8/2007 | Tempelaars et al. | 250/492.1 |
| 2007/0229791 A1 | 10/2007 | Inoue | |
| 2007/0247640 A1 | 10/2007 | Magome et al. | |
| 2007/0263191 A1 | 11/2007 | Shibazaki | |

FOREIGN PATENT DOCUMENTS

| | | |
|---|---|---|
| EP | 1 037 117 A2 | 9/2000 |
| EP | 0 906 590 B1 | 8/2003 |
| EP | 1 372 040 A2 | 12/2003 |
| JP | 2000-323404 A | 11/2000 |
| WO | WO 2005/088686 A1 | 9/2005 |
| WO | WO 2005/096354 A1 | 10/2005 |
| WO | WO 2007/097380 A1 | 8/2007 |

OTHER PUBLICATIONS

English-Language Abstract of Japanese Patent Publication No. 2000-323404 A, published Nov. 24, 2000; 2 pages.

(Continued)

*Primary Examiner* — Hoon Song
*Assistant Examiner* — Mona M Sanei
(74) *Attorney, Agent, or Firm* — Sterne, Kessler, Goldstein & Fox P.L.L.C.

(57) ABSTRACT

Embodiments of the invention relate to a method for determining exposure settings for a target field on a substrate in a lithographic exposure process, including providing calibration data by determining the position of a calibration field in a first direction at a plurality of calibration positions in a second and third direction relative to the position of the calibration field. The method also includes providing production data by establishing the position on the substrate of the target field in the second and third direction and by measuring the position of the exposure field in the first direction at least one measurement position relative to the position of the exposure field in the second and third direction.

12 Claims, 5 Drawing Sheets

OTHER PUBLICATIONS

Figure 1:
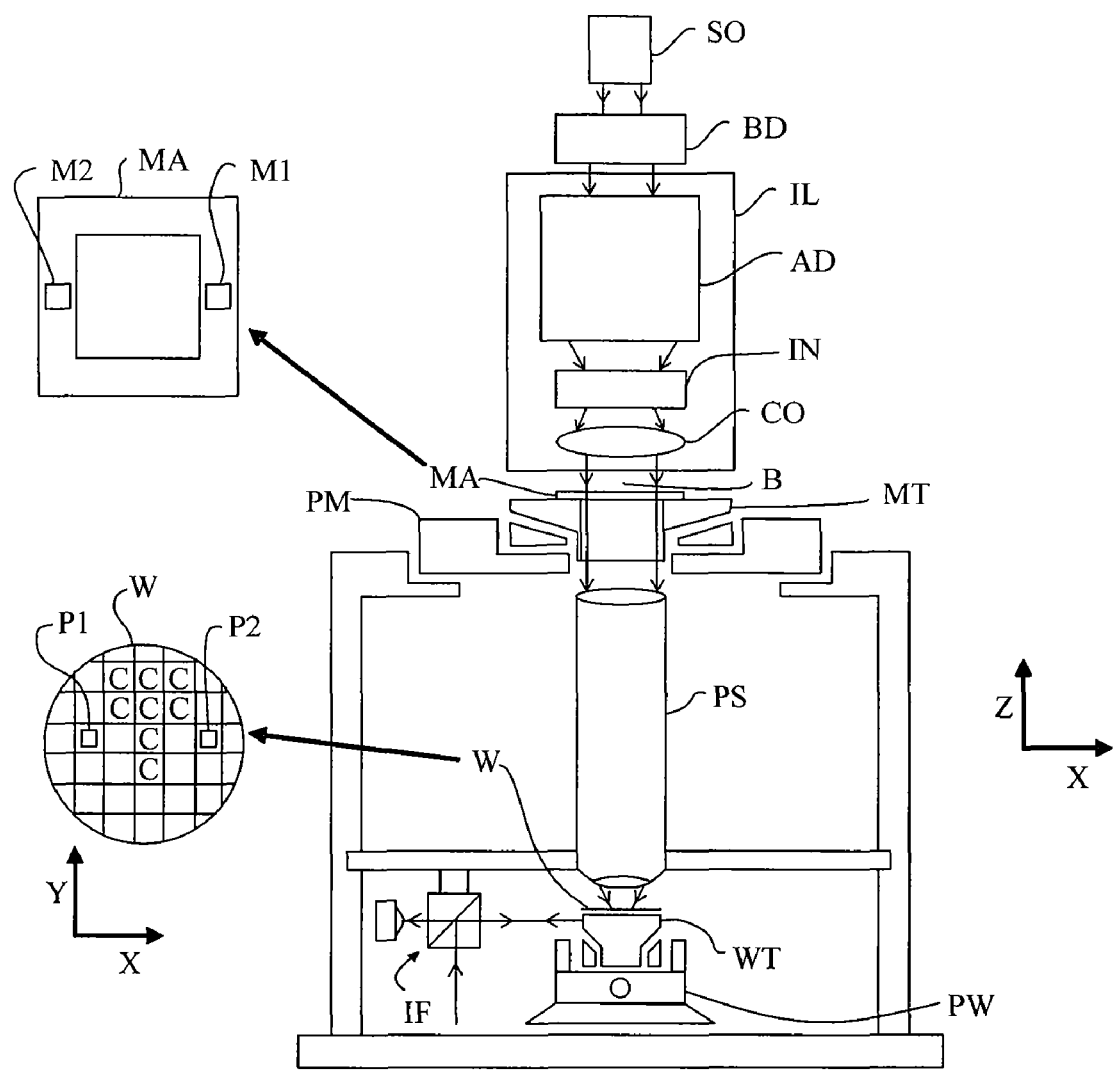

English-Language Abstract of International Patent Publication No. 2005/088686 A1, published Sep. 22, 2005; 2 pages.
English-Language Abstract of International Patent Publication No. 2005/096354 A1, published Oct. 13, 2005; 2 pages.
English-Language Abstract of International Patent Publication No. 2007/097380 A1, published Aug. 30, 2007; 1 page.
English-Language Translation of Notice of Reasons for Rejection directed to related Japanese Patent Application No. 2009-026370, mailed Jun. 16, 2011, Japanese Patent Office; 4 pages.

* cited by examiner

METHOD FOR DETERMINING EXPOSURE
SETTINGS, LITHOGRAPHIC EXPOSURE
APPARATUS, COMPUTER PROGRAM AND
DATA CARRIER

CROSS-REFERENCE TO RELATED
APPLICATIONS

The present application claims the benefit of U.S. Provisional Patent Appl. No. 61/006,950, filed Feb. 7, 2008, which is incorporated by reference herein in its entirety.

BACKGROUND

1. Field

Embodiments of the present invention relate to a method for determining exposure settings, a lithographic exposure apparatus, a computer program and a data carrier.

2. Background

A lithographic exposure apparatus is a machine that applies a desired pattern onto a substrate, usually onto a target field of the substrate. A lithographic exposure apparatus can be used, for example, in the manufacture of integrated circuits (ICs). In a lithographic projection apparatus commonly used in the manufacture of integrated circuits, a patterning device, which is alternatively referred to as a mask or a reticle, may be used to generate a circuit pattern to be formed on an individual layer of the IC. This pattern can be transferred onto a target field (e.g., including part of, one, or several dies) on a substrate (e.g., a silicon wafer). Transfer of the pattern is typically done by using a projection system for imaging the pattern on the patterning device onto a layer of radiation-sensitive material (resist) provided on the substrate supported by a wafer table. In general, a single substrate will contain a network of adjacent target fields that are successively patterned.

In a lithographic exposure process for a wafer known from US Patent Appl. Publ. No. 2007/0263191, incorporated herein by reference in its entirety, the position of the target field (portion) in the direction of the optical axis of the projection system is determined with a multipoint AF system arranged to measure with one row M detection points (spots) simultaneously. The different spots form a linear array with different positions in a direction X perpendicular to a scanning direction Y. These position measurements are used to bring the target fields in focus of the projection exposure system.

A wafer includes a plurality of target fields separated from each other by scribe lanes. The wafer will be cut at the scribe lanes during a later process step.

The linear array of spots forms an elongate detection area with a length set around the width of the wafer.

The detection points are each associated with a sensor of the multipoint AF sensor. The offset between the sensors of the multipoint AF sensor is calibrated by measuring the positions of a CD bar using the multipoint AF sensor and combining the measurements with Z sensors positioned on two sides of the elongate detection area. The offsets correspond to the deviation between the value measured at a certain X position (and thus a certain detection point) and the linear interpolation between the measurements of the Z-sensors.

Additionally a traverse Z-moving correction is performed. This is to avoid inaccurate positioning of the wafer table during exposure because of measurement errors made by encoders used to measure and control the position of the wafer table. During the traverse Z-movement correction, the position of the wafer table is measured using Z-sensors while detecting surface information with the multipoint AF-sensor at detection points having predetermined distances. Because the offset between sensors of the multipoint AF sensor has been calibrated earlier, when two sensors of the multipoint AF sensor measure the same point, they should obtain the same value. The differences between measurements at the same point reflect differences of the position of the wafer table (also measured with the Z-sensors) and inaccuracies. Then the Z-sensors are calibrated to compensate for these inaccuracies.

According to the method a step includes focus mapping. During focus mapping a straight line (centerline) parallel to the Y-axis that passes through the center of the wafer table (which substantially coincides with the center of the wafer) coincides with straight line LV through a plurality of encoders. The wafer table is scanned in the Y-direction controlling its position using the Z-sensors. During the scan, the multipoint AF sensor measures at predetermined sampling intervals.

Finally, the focus map is used to determine a position during exposure, the wafer table is scanned by keeping it under Z-sensor control after relating the measurements from the focus mapping with the best focus position of the projection system.

As said earlier the detection points (spots) form a linear array with different positions in a direction X perpendicular to the scanning direction Y. This is to prevent cross talk between the detection points. Between the detection points the position of the target area may differ for the position at the detection points themselves. This means that between the detection points it is not possible to determine the best focus position, which consequently leads to a lower overall focus control for the target field.

SUMMARY

According to an aspect of the invention there is provided a method having better focus control than previous methods. In an embodiment, a method for determining exposure settings for a target field on a substrate in a lithographic exposure process includes: providing calibration data by determining the position of a calibration field in a first direction at a plurality of calibration positions in a second and third direction relative to the position of the calibration field; providing production data by establishing the position on the substrate of the target field in the second and third direction; measuring the position of the exposure field in the first direction at least one measurement position relative to the position of the exposure field in the second and third direction; executing a comparison between the at least one first relative measurement position and the plurality of relative calibration positions; and using the comparison to determine exposure settings based on the measured position of the exposure field in the first direction and the calibration data, wherein the calibration data relates to at least one relative calibration position which differs from the at least one relative measurement position.

According to another aspect of the invention, there is provided a lithographic exposure apparatus for exposing a target field, arranged to store calibration data including the position of a calibration field determined at a plurality of calibration positions in a second and third direction relative to the position of the calibration field, and including an alignment sensor arranged to measure the position of the target field in the second and third direction and a sensor to measure the position of the target field in the first direction at least one measurement position relative to the position of the target field in the second and third direction.

The lithographic exposure apparatus may further include a unit arranged to: execute a comparison between the at least one first relative measurement position and the plurality of calibration positions; and to use the comparison to determine exposure settings based on the measured position of the target field in the first direction and the calibration data, wherein the calibration data relates to at least one relative calibration position which differs from the at least one relative measurement position.

According to an aspect of the invention there is provided a computer program that, when loaded on a processing arrangement, is arranged to perform any one of the methods according to the invention.

According to an aspect of the invention there is provided a data carrier, including a computer program according to the invention.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to an embodiment of the invention.

Figure 2:
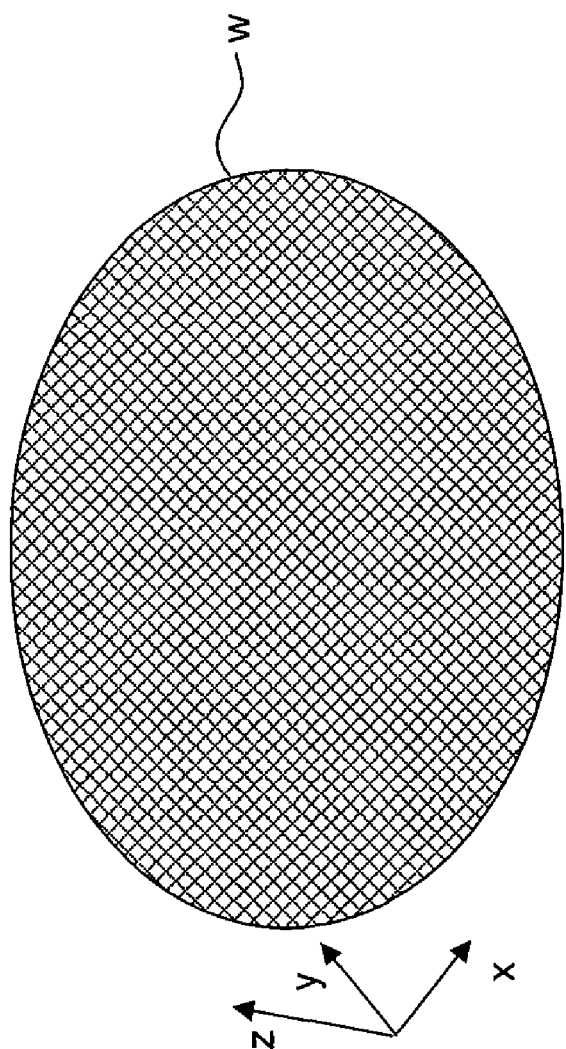

FIG. 2 schematically depicts an exemplary substrate coordinate system.

FIG. 3 schematically depicts a level sensor used in an embodiment of the invention.

Figure 4:
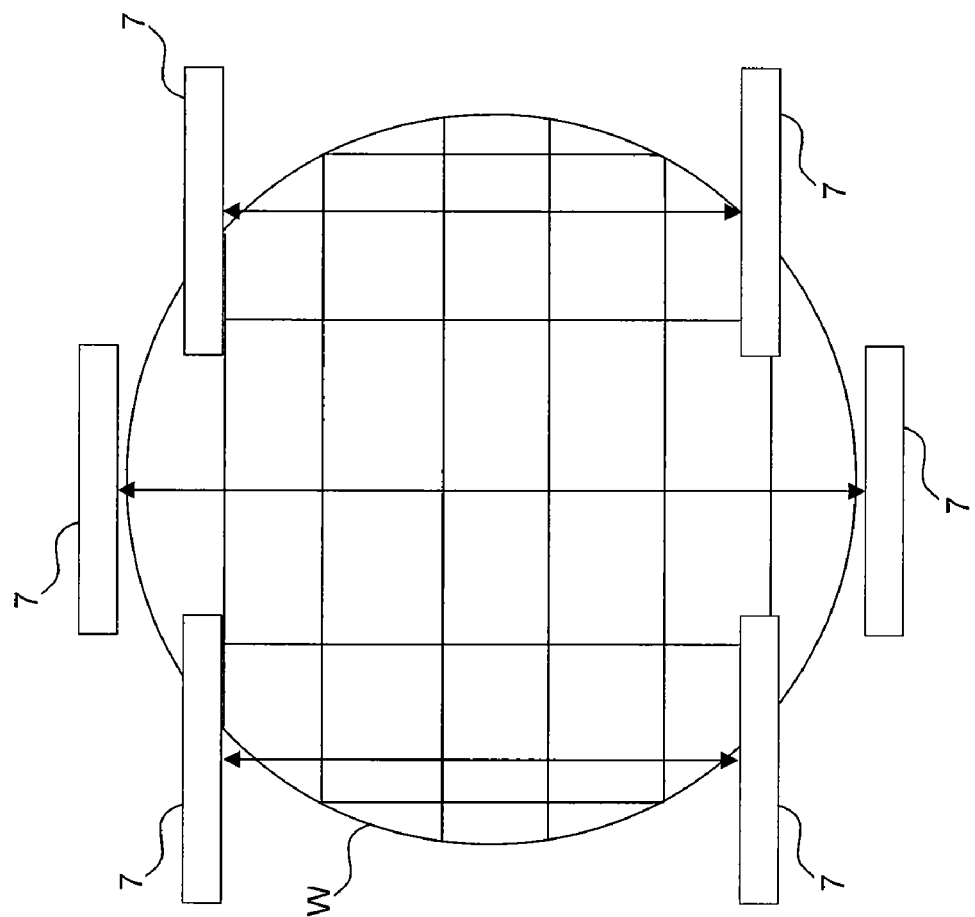

FIG. 4 schematically depicts the strokes of a scan of the level sensor over a substrate according to layout independent leveling in an embodiment of the present invention.

Figure 5:
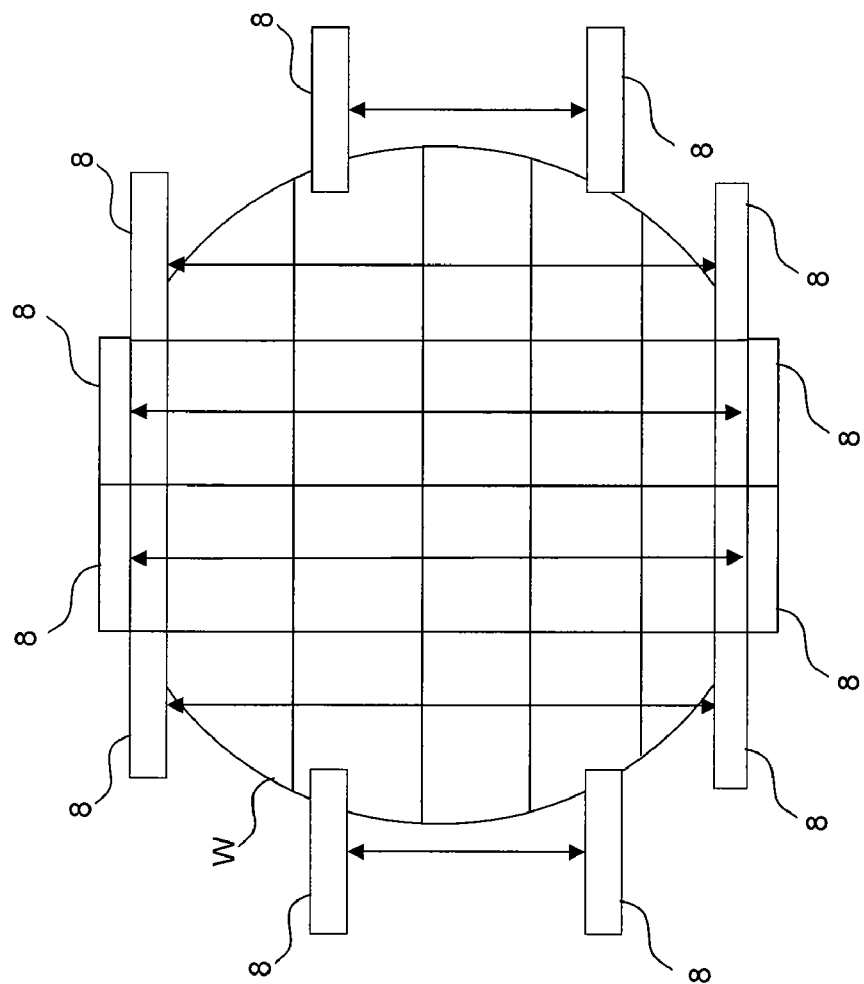

FIG. 5 schematically depicts the strokes of a scan of the level sensor over a substrate according to layout dependent leveling in an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

A lithographic exposure apparatus according to an embodiment of the invention (FIG. 1) includes:
 an illumination system (illuminator) IL configured to condition a radiation beam B (e.g., UV radiation or EUV radiation).
 a support structure (e.g., a mask table) MT constructed to support a patterning device (e.g., a mask) MA and connected to a first positioner PM configured to accurately position the patterning device in accordance with certain parameters;
 a substrate table (e.g., a wafer table) WT constructed to hold a substrate (e.g., a resist-coated wafer) W and connected to a second positioner PW configured to accurately position the substrate in accordance with certain parameters; and
 a projection system (e.g., a refractive projection lens system) PS configured to project a pattern imparted to radiation beam B by patterning device MA onto a target field C (e.g., including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target field of the substrate. It should be noted that the pattern imparted to the radiation beam may not exactly correspond to the desired pattern in the target field of the substrate, for example if the pattern includes phase-shifting features or so called assist features. Generally, the pattern imparted to the radiation beam will correspond to a particular functional layer in a device being created in the target field, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps (such as measurements with a level sensor as will be explained later) may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target field C of substrate W. With the aid of second positioner PW and position sensor IF (e.g., an interferometric device, linear encoder or capacitive sensor), substrate table WT can be moved accurately, e.g., so as to position different target fields C in the path of radiation beam B. Position sensor IF can for instance be an interferometric device, or a linear encoder with the detector fixed on substrate table WT, second positioner PW or fixed to metro frame (MF). Similarly, first positioner PM and a further position sensor (which is not explicitly depicted in FIG. 1) can be used to accurately position mask MA with respect to the path of radiation beam B, e.g., after mechanical retrieval from a mask library, or during a scan. The further position sensor can for instance be any of the same type as mentioned for position sensor IF. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target fields, they may be located in spaces between target fields (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target field C at one time (i.e., a single static exposure). Substrate table WT is then shifted in the X and/or Y direction so that a different target field C can be exposed. In step mode, the maximum size of the exposure target field limits the size of the target field C imaged in a single static exposure.

2. In scan mode, mask table MT and substrate table WT are scanned synchronously while a pattern imparted to the radiation beam is projected onto a target field C (i.e., a single dynamic exposure). The velocity and direction of substrate table WT relative to mask table MT may be determined by the (de-)magnification and image reversal characteristics of projection system PS. In scan mode, the maximum size of the exposure target field limits the width (in the non-scanning direction) of the target field in a single dynamic exposure, whereas the length of the scanning motion determines the height (in the scanning direction) of the target field.

3. In another mode, mask table MT is kept essentially stationary holding a programmable patterning device, and substrate table WT is moved or scanned while a pattern imparted to the radiation beam is projected onto a target field C. In this mode, generally a pulsed radiation source is employed and the programmable patterning device is updated as required after each movement of substrate table WT or in between successive radiation pulses during a scan. This mode of operation can be readily applied to mask less lithography that utilizes programmable patterning device, such as a programmable mirror array of a type as referred to above.

Combinations and/or variations on the above described modes of use or entirely different modes of use may also be employed.

Throughout the document reference will be made to the substrate coordinate system. An exemplary substrate coordinate system is depicted in FIG. 2. In the substrate coordinate system, the x- and y-direction are parallel to the surface of substrate W. The z-direction is perpendicular to the surface of substrate W with positive values on the side of substrate W from which the radiation beam arrives to expose substrate W.

Substrate W includes a plurality of equal target fields separated from each other by scribe lanes such that columns of target fields are formed on substrate W. Substrate W will be cut at the scribe lanes during a later process step. The target fields have their own coordinate system with an x'-direction and a y'-direction being aligned with the x-, and y-direction of substrate W. The origins of each target field coordinate system correspond to the position in the coordinate system of substrate W with the smallest or most negative x- and y-coordinate. Through the origins of the target fields in one column there is a y-reference line.

Level Sensor

Figure 3A:
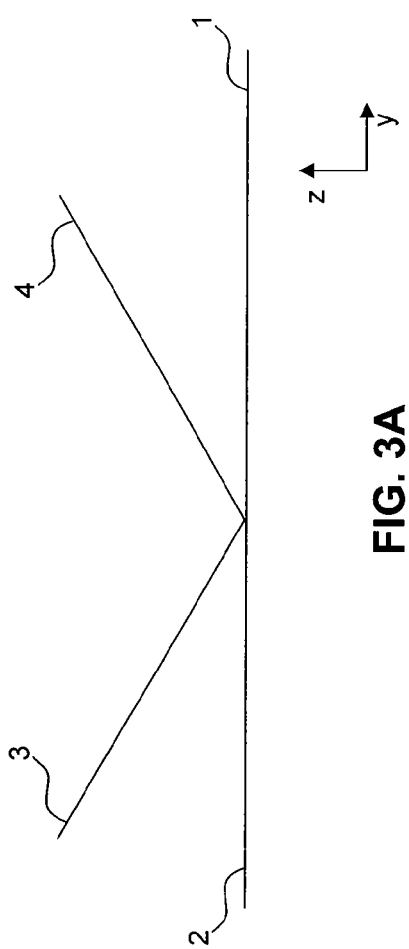
Figure 3B:
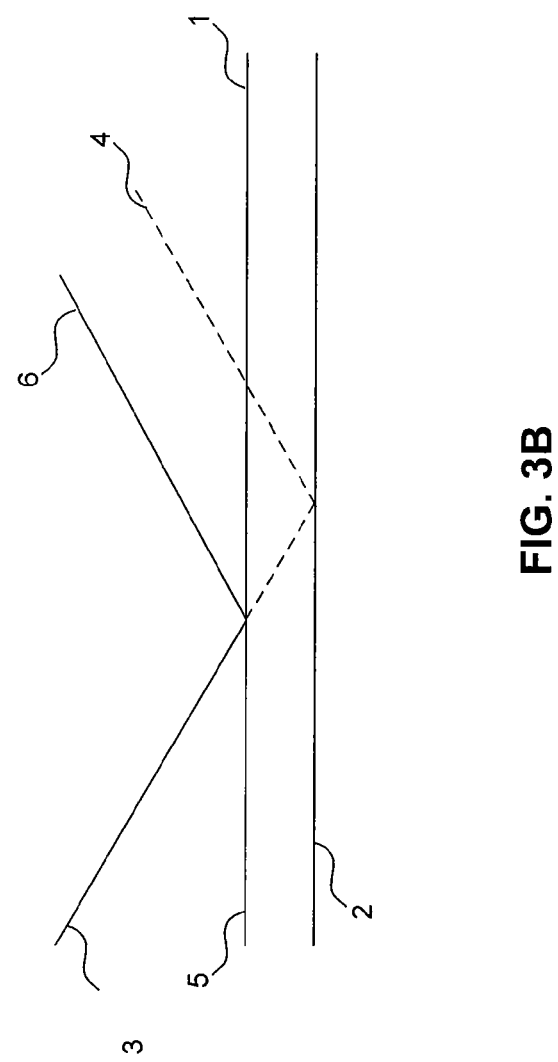

In an embodiment of the invention, the lithographic exposure apparatus further includes a level sensor as described in EP1037117A1 page 27, line 26 to page 31, line 14, in relation to FIGS. 14A to 14G, 15, and 15A of EP1037117A1, which is incorporated by reference herein. The level sensor is arranged to measure heights of target fields on substrate W or of areas on the substrate table. The heights represent the position in a first direction. The working principle of the level sensor is best explained as follows (FIGS. 3a and 3b). A surface 1, of which the height is to be measured, is brought in a reference position 2 and is illuminated with a measurement beam 3 of radiation (FIG. 3a). The measurement beam of radiation impinges on the surface to be measured under an angle which is less than 90 degrees. Where measurement beam 3 of radiation impinges on the surface, a measurement spot is formed. Because the angle of incidence is equal to the angle of reflection, the measurement beam of radiation is reflected back from the surface with the same angle to form a reflected beam 4 of radiation. Measurement beam 3 of radiation and reflected beam 4 of radiation define a measurement plane which is perpendicular to surface 1. The level sensor measures the position of reflected beam 4 of radiation in the measurement plane.

If surface 1 is moved in the direction of measurement beam 3 of radiation to a new position 5 and another measurement is done (FIG. 3b), the measurement spot remains on the same position of the surface. However, measurement beam 3 of radiation is reflected to form a shifted reflected beam 6. Shifted reflected beam 6 is reflected in the same direction as reflected beam 4 when the surface was in reference position 2. However, shifted reflected beam 6 of radiation formed with surface 1 in new position 5 is shifted with respect to reflected beam 4 of radiation formed with surface 1 in reference position 2. The shift between reflected beam 4 and shifted reflected beam 6 in the measurement plane is used as a measure of the movement of the surface.

During normal operation, the surface to be measured has an unknown height. The height of the surface is measured after calibrating the sensor to give zero height for a certain value.

In an embodiment the level sensor provides nine parallel measurement beams to form nine measurement spots in a linear array having different positions in the x-direction and is arranged to measure the nine corresponding positions simultaneously. In other embodiments different numbers of measurement beams are used. The measurement spots need not all be on one line or to all have different positions in the x-direction. The measurement spots together form an elongate detection area 7 (FIG. 4) having its full width in the x-direction.

The lithographic exposure apparatus is arranged to move the substrate in a direction parallel to surface 1 of substrate W while performing level sensor measurements, the y-direction. This will be referred to as performing a level sensor scan. Such a scan is used to obtain height data for different positions of a target field of substrate W. The height is the position of the surface of the substrate in a direction perpendicular to its surface 1, i.e. in the z-direction. In an embodiment, substrate W is moved by second positioner PW while being supported by substrate table WT such that the level sensor measurements for different x,y positions in the substrate coordinate system are as constant as possible (for instance zero). This is done by correcting the z-position of substrate table WT based on measurements for other x,y positions so that it can be expected that the following level sensor measurement will be zero again.

Process

In the next section different steps of an embodiment of a method according to the aspects of the exposure process of substrate W are described.

The embodiment includes the steps of focus mapping, alignment, calibration, determination of exposure settings and exposure. Although focus mapping is typically performed later during the method, it will be explained before the calibration.

Alignment

According to a step of the method, the positions of alignment marks on substrate W are determined with an alignment sensor. Such an alignment sensor is for instance known from EP 0906590, EP 1 372 040 and US2007/0263191A1, which are incorporated by reference herein in their entireties. During alignment, the position of, for instance, 16 alignment marks is determined and those positions are used to determine the position of all target fields on substrate W in x- and y-direction, i.e. in a plane parallel to the substrate surface. The position of all target fields is stored as production data.

Focus Mapping

After determining the positions of the target fields in the alignment step, the level sensor is used to scan the substrate target fields in strokes. When scanning a target field, the height is measured with, for example, 9 spots for 9 x'-coordinates. The level sensor measures at fixed time intervals while the substrate is moved with a constant velocity in the y-direction (and thus the y'-direction). Therefore the level sensor measures with fixed intervals in the y'-direction as well. As a result, for a first target field a first set of target field measurements is obtained at a first set of target field measurement coordinates in the coordinate system of the target field (x',y').

The level sensor scan is performed such that the number of 'strokes' (indicated by arrows) needed to scan the complete substrate, is minimized (FIG. 4) to optimize the production capacity or throughput of the lithographic exposure apparatus. This implies that during a first stroke the level sensor measurement spots in elongate detection area 7 have a first set of 9 stroke coordinates in x'. A few spots may be outside the wafer and are discarded. During a second stroke the level sensor measurement spots in elongate detection area 7 have a second set of 9 stroke coordinates in x'. The first set and the second set of stroke coordinates in x' differ when the 'strokes' have a pitch which differs from the pitch between the columns of the target fields. In other words, the level sensor data are gathered independently of the layout of the target fields on the substrate. This is referred to as layout independent leveling.

To further minimize the time for focus mapping (and thus to optimize the production capacity or throughput of the lithographic exposure apparatus), the substrate is moved with the constant velocity throughout the stroke, i.e. while measuring several target fields in a column. As the level sensor measures at fixed time intervals, it measures at fixed distances in the y'-direction. The pitch between the target fields (size in y'-direction plus scribe lane width in y'-direction) is not an integer multiple of the fixed distances in the y'-direction. Therefore the level sensor measurements in the first target field are obtained at a first set of y'-coordinates and the level sensor measurement in the second target field are obtained at a second set of y'-coordinates.

Moreover, the scanning direction is reversed between two adjacent strokes, leading to further sets of y'-coordinates for the measurements. As a consequence there is a high number of x'-y' combinations for which measurements are obtained during focus mapping. For each target field, there is a set of target field measurement coordinates in the coordinate system of that target field.

The measured heights are stored together with their corresponding x'- and y'-coordinates as production data as well. Alternatively, alignment is performed later or simultaneously and the measured heights are stored together with their corresponding x- and y-coordinates in the substrate coordinate system. In a later step of the method, the x- and y-coordinates will be coupled to the positions of the target fields on the substrate and the measurement positions corresponding to the measured heights will be known in the x'- and y'-coordinate systems of the target fields.

Since the level sensor measurements are not constrained by the layout of target fields on the substrate, the full width of the level sensor can be used. The pattern of 'strokes' on the substrate is chosen based on the full width to minimize the time spent doing level sensor measurements to improve the production capacity (throughput) of the lithographic exposure apparatus. This is particularly important at the 'sides' of the substrate where there are strokes with a very small number of sensor spots (for instance 5) are used to take data if layout dependent leveling (i.e. focus mapping positioning the strokes (indicated by arrows) equally with respect to a reference line of each column) is applied (FIG. 5). In FIG. 5, an effective elongated area (8) has a width smaller than the full width of elongated area 7 (not shown) to reflect the reduced number of spots.

In fact, the width of the target field is limited by expensive, difficult to build exposure optics of projection system (PS). In contrast a level sensor is a simpler device. It is more feasible to build a wide level sensor. By building a wide level sensor and applying layout independent leveling, even with relatively wide exposure target fields, the number of strokes may be reduced. Thus, even on layouts with the relatively wide target fields, the leveling time may be reduced when layout independent leveling is used.

Thus FIG. 4 shows the same substrate W as shown in FIG. 5. However, in the embodiment related to FIG. 4 layout independent leveling is performed using a level sensor arrange to measure simultaneously with 9 spots. In the layout dependent case, explained with reference to FIG. 5, only 5 spots were used. With layout independent leveling, all 9 spots are used. Also the strokes are positioned to optimize their uses at the 'sides' of the substrate.

Calibration

During calibration the level sensor is used to measure the height of substrate surface 1 at a plurality of positions in a calibration field. The calibration field is a target field selected for calibration.

The calibration field is scanned with the level sensor spots at least once in every possible coordinate in the target field coordinate system applied during focus mapping. So for all x'-y' combinations for which measurements are obtained during focus mapping, a calibration measurement is done to determine the height.

Alternatively, the calibration field is measured multiple times and the results are averaged for corresponding x'-y' coordinates within the calibration field. Additionally or alternatively, calibration measurements are obtained from a second calibration field. The calibration field is in a different column on a different substrate. Other variants, such as being in a different column on the same substrate etc. are also possible.

Thus the calibration delivers calibration data including calibration measurements and corresponding calibration coordinates. As there may be hundreds of target fields on a substrate, the calibration field is typically not the same on the same location on substrate W as the target field for which the calibration data are used. Of course, at least one target field is expected to have the same location on substrate W as the calibration field.

In an embodiment, a calibration mechanism is used to generate a robust set of measurements to use as input for the calibration. The target fields with the highest standard deviation value (i.e. variation between the calibration measurements in the target field) are discarded from the calibration. The (remaining) target fields may be averaged point by point to create the calibration data (fingerprint data). Alternatively, a plurality of calibration measurements are performed for the calibration coordinates, for instance by measuring the first calibration field a plurality of times at the same calibration coordinates or measuring a plurality of calibration fields at the same calibration coordinates. Then the average calibration measurement and standard deviation are determined per calibration coordinate. A confidence interval is computed around the average calibration measurement. Calibration measurements having values outside the confidence interval are discarded and the average calibration measurement is computed again. The average calibration measurements are used for the calibration data.

In an embodiment, the calibration values are not measured by the level sensor. Instead they are predicted by a model. The model itself may use measurements as input but can for instance predict process effects of layers on the substrate. Alternatively, the target field measurements are done with the level sensor and the calibration measurements are measured with a second sensor. The second sensor may be of a different type, for instance of a type for which the dependency of the material of the layers on the substrate differs from that of the level sensor. The level sensor depends on the material of the layers of the substrate because of apparent surface. The second sensor may be an air gauge such as described in U.S. Pat. No. 7,472,580, incorporated herein by reference in its entirety. An air gauge works on gas pressure and thus works on a different measuring principle.

Determination of Exposure Settings

During exposure the substrate is supported by a substrate table. The substrate table is scanned according to exposure settings such as set points. The set points together form a group of positions the substrate will have during the exposure. Determining the set points is done by minimizing the difference between the plane of the exposure slit of projection system PS and the height of substrate W. This is for instance described in EP1037117.

It is to be noted that the exposure slit may be curved leading to a corresponding group of set points. Additionally or alternatively, the substrate may be curved in a way which can not be matched by the set points to fit to the (curved) exposure slit. In such case there are uncorrectable errors.

The first set of target field measurement coordinates is compared to the positions where calibration measurements of the calibration field are available, the calibration coordinates. The calibration measurements of which the coordinates correspond to the first set of target field measurement coordinates are used to calculate a first calibration set of set point values.

Additionally all calibration measurements are used to calculate an optimal calibration set of set point values. The optimal calibration set of set point values is based on calibration measurements at more coordinates in the calibration field. Therefore, minimizing the difference between the plane of the exposure slit and the height of substrate W can be performed more accurately.

The first calibration set of set point values are subtracted from the optimal calibration set of set point values to give a set of correction values.

Additionally the first set of target field measurements and the corresponding first set of target field measurement coordinates are used to calculate a first measurement set of set point values. The first measurement set of set point values is corrected by adding the set of correction values.

By correcting the measurement set of set point values, the information obtained throughout all calibration measurements is used. Because they are obtained in every possible coordinate in the target field coordinate system applied during focus mapping, whereas the target field measurements for the first target field is only a subset of those possible coordinates, information on the height of the target field between the target field measurement coordinates is added. Therefore the set point values improve the focus control of the method.

Additionally, the method is advantageous in case the focus mapping is performed with one spot partially falling in the first target field and partially falling in the scribe lane. In this situation the measurement with closest distance to the edge is the measurement at the next x'-coordinate or the previous or next y'-coordinate as will be clear to the person skilled in the art. In an embodiment, the calibration coordinates are chosen so that the spots precisely fall within the edges of the target field. This can for instance be done after obtaining precise alignment data and determining the precise positions of the calibration field or by scanning the calibration field with a very dense grid and determining which calibration measurements are not valid as a part of the spot fell in the scribe lane while measuring. With such calibration data, height information closer to the edge of the target field is used for determining exposure settings.

After determining the exposure settings the target field is exposed to a patterned beam of radiation to form a pattern in a layer of photosensitive material on substrate W.

Alternative Embodiments

Alternatively the calibration measurements are not in every possible coordinate in the target field coordinate system. Instead a dense grid of calibration coordinates is used.

Again, all calibration measurements are used to calculate an optimal calibration set of set point values.

The first set of target field measurement coordinates is compared to the grid of calibration coordinates. By linear interpolation the calibration measurements are used to determine fictive calibration measurements at coordinates corresponding to the first set of target field measurement coordinates.

The fictive calibration measurements and the first set of target field measurement coordinates are used to determine a fictive set of set point values. The fictive set of set point values is subtracted from the optimal calibration set of set point values.

Also the first set of target field measurements and the corresponding first set of target field measurement coordinates are used to calculate a first measurement set of set point values. The first measurement set of set point values is corrected by adding the set of fictive correction values.

In yet another embodiment, improved set point values are determined by correcting the measurement values. In the embodiment calibration measurements are obtained, for instance at a dense grid or at every possible coordinate in the target field coordinate system applied during focus mapping. The calibration data is used to calculate fictive target field measurements at coordinates that correspond to the first set of target field measurement coordinates by linear interpolation of the calibration measurements between the calibration coordinates. Additionally the calibration data is used to calculate further fictive target field measurements at coordinates that correspond to a second set of target field measurement coordinates for a second target field. This again is done by linear interpolation. The fictive target field measurements are subtracted from the further fictive target field measurements to give measurement correction values. Then the measurement correction values are added to the target field measurement values to give corrected measurement values. The corrected measurement values now represent the values that the level sensor would have measured during focus mapping, when it would have measured at the second set of target field measurement coordinates. Then an optimized set of set point values is determined based on the corrected measurement values and the second set of target field measurement coordinates.

This has the advantage over not correcting the measurement values during layout independent leveling that set points are calculated for the first and second target field based on the same measurement coordinates. Therefore, variations in focus performance between the first and second target field are compensated for. If layout dependent leveling would be applied instead (which imposes that every target field is measured with the same target field measurement coordinates to prevent variations in focus performance) more time would be needed to ensure the focus performance which degrades the throughput. Thus the embodiment improves the reliability of the exposure over substrate W with respect to layout independent leveling without calibration as for each target the same focus performance can be achieved while achieving a higher speed than when applying layout dependent leveling.

In an embodiment focus performance is achieved by calculating settings for movement of the patterning device. Alternatively settings of projection system PS are changed so that the exposure slit adepts to the position of the target field with a constant position of the patterning device. Alternatively, a combination of movement of the patterning device, the projection system settings, and the substrate is calculated.

In an embodiment focus performance is achieved by calculating the height settings and/or tilt settings of the wafer table during exposure. In an embodiment, this is applied with the lithographic exposure apparatus in the step mode.

In an embodiment first the calibration and the focus mapping are performed. The calibration measurements and the target field measurements are stored with their coordinates in the substrate coordinate system. After performing the alignment and determining the position of the target fields on the substrate and thus determining the origins of the target field coordinate systems in the substrate coordinate system, the determination of the exposure settings is performed.

So, there is provided a method of computing exposure focus data for a target field of a substrate to be exposed in a lithographic apparatus in accordance with the exposure focus data, the method including performing a level sensor scan over the target field providing level sensor data for the target field, wherein the level sensor scan is performed at a relative position with respect to the target field and determining corrected exposure focus data using the level sensor data and predetermined calibration data to correct for the relative position of the level sensor scan with respect to the target field.

This embodiment allows correcting for the relative position with respect to the target field. This relative position influences the level sensor data (for instance because of the topology on the target field), and consequently influences the computed exposure focus data. To correct for this differences, the method as provided can be used.

It will be clear to the skilled person that other embodiments are encompassed by the invention as well, such as obtaining calibration data to calibrate only in one direction (the x'- or the y'-direction) and that some improvement can already be obtained by using a calibration measurement having a coordinate that differs from a target field measurement coordinate.

In a lithographic exposure apparatus according to the invention, the determination of the exposure settings is performed in a unit including a computer system. The computer system is fed with a computer program via a data carrier, the computer program being arranged to perform a method according to an embodiment of the invention.

In an embodiment, target fields surrounded by other target fields are measured and some target field measurements are done on such other target fields. The target field measurement on the other target fields can be used as additional calibration data. In an embodiment, elongate detection area 7 spans the complete width of substrate W and samples at different x-coordinates at the same time. Since the target fields in practice have a pitch that differs from the pitch between the measurement spots, the target field measurements include information on different target fields x'-coordinates. The target field measurements throughout substrate W are used as calibration data. No separate calibration scans are needed. All target field measurements are related to their respective x'-coordinates and y'-coordinates and taken as calibration measurements for those coordinates in the calibration field. In this way, per target field, data from all other target fields is used in the form as calibration data as explained previously.

The method according to embodiments of the invention can be used together with other target field calibrations. This includes the Process Dependent Offset Calibration (a correction for an offset between measured heights caused by a difference in compositions of the materials of the substrates of which the heights are measured for instance related to the presence or absence of a circuit pattern) and the Process Dependent Gain Correction (a correction for differences in the measured intensities at equal heights for different material compositions of the substrates for instance related to the presence or absence of a circuit pattern).

If there is overlap or unused sensors in the layout independent leveling strokes, then the stroke positions can be adjusted to optimize sampling for focus performance reasons. Multiple samples at more focus sensitive positions or special measurement positions to match the positions of the target fields at the edges of the substrate are two possibilities.

Calibrating leveling measurements to be independent of layout has further possible throughput advantages. When the leveling measurements are required to have a precise position relative to the layout, then an alignment operation of sufficient accuracy is required prior to the leveling measurements. If leveling can be calibrated to be independent of position, which is accomplished according to the current invention, then the constraint that an alignment be performed before leveling can be dropped. This relaxation of constraints provides further opportunities to reduce the time spent during the substrate measurement sequence and to decouple the order in which steps of the method are performed. For instance, the alignment results can be processed while already starting the leveling measurements. Additionally, it may not be necessary to have a calibrated alignment sensor available before starting the focus mapping or the calibration.

The above embodiments can be used in dual stage lithographic exposure apparatus. In dual stage lithographic exposure apparatus, there are two stages for supporting substrates to be exposed to radiation. While one substrate is loaded, unloaded or measured, the other one is exposed. The above embodiments can also be used in a tandem stage lithographic exposure apparatus. In such an exposure apparatus, there is a first stage for supporting a substrate which is to be exposed. Also there is a second stage which is not arranged to support substrates during their exposure. The second stage may include sensors and may be used for controlling the immersion liquid for instance that the immersion liquid does not leak while the first stage is in a position for loading and unloading a substrate.

Although specific reference may be made in this text to the use of lithographic exposure apparatus in the manufacture of ICs, it should be understood that the lithographic exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target field," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers. These processed layers include the alignment marks to be read during alignment.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Measuring the height of the surface may be applied to set local temperatures or pressure during the exposure of the substrate to the patterning device.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for determining exposure settings for a target field on a substrate in a lithographic exposure process, comprising:
   determining calibration data comprising a plurality of calibration positions including position of a calibration field in a first direction at the plurality of calibration positions in a second and third direction relative to the position of the calibration field, wherein the calibration data is measured using only a single level sensor;
   determining production data by establishing position of the target field on the substrate in the second and third direction;
   measuring position of the target field in the first direction at at least one measurement position relative to position of the target field in the second and third direction;
   comparing the at least one measurement position and the plurality of calibration positions;
   determining a first set of exposure settings based on the calibration data, wherein the calibration data relates to at least one of the plurality of calibration positions which differs from the at least one measurement position;
   determining a second set of exposure settings based on the measured position of the target field; and
   correcting the second set of exposure settings based on the comparing and the first set of exposure settings to determine the exposure settings.

2. The method according to claim 1, wherein the position of the target field in the first direction is measured using a second sensor and wherein the single sensor and the second sensor are based on a different measuring principle.

3. The method according to claim 1, wherein the position of the calibration field on a calibration substrate differs from the position of the target field on the substrate.

4. The method according to claim 3, wherein the calibration substrate and the substrate are different substrates.

5. The method according to claim 1, wherein the exposure settings comprise at least one member of a set comprising height settings, tilt settings and scanning set points for a support for supporting the substrate comprising the target field during exposure of the target field.

6. The method according to claim 1, further comprising:
   correcting the measured position of the target field based on the comparing and the calibration data; and
   determining the exposure settings based on the corrected measured position.

7. The method according to claim 1, wherein providing the production data comprises measuring position of a further target field in the first direction at at least one position relative to the position of the target field while measuring the position in the first direction of the target field.

8. The method according to claim 1, wherein a distance to a first edge of the calibration field of at least one of the plurality of positions is smaller than a distance to corresponding edge of the target field of the at least one position.

9. The method according to claim 1, wherein providing the calibration data comprises determining position of a further calibration field in the first direction at a further plurality of positions in the second and third direction relative to the position of the further calibration field.

10. The method according to claim 1, comprising exposing the target field in accordance with the determined exposure data.

11. A lithographic exposure apparatus for exposing a target field, comprising:
   a storage device configured to store calibration data comprising position of a calibration field determined at a plurality of calibration positions in a second and third direction relative to the position of the calibration field, wherein the calibration data is measured using only a single level sensor;
   an alignment sensor arranged to measure position of the target field in the second and third direction;
   a sensor to measure position of the target field in a first direction at at least one measurement position relative to the position of the target field in the second and third direction; and
   a unit configured to:
      compare the at least one measurement position and the plurality of the calibration positions;
      determine a first set of exposure settings based on the calibration data, wherein the calibration data relates to at least one of the plurality of calibration positions which differs from the at least one measurement position;
      determine a second set of exposure settings based on the measured position of the target field; and
      correcting the second set of exposure settings based on the comparing and the first set of exposure settings to determine the exposure settings.

12. A non-transitory computer readable storage medium having instructions stored thereon that, if executed by a computing device, cause the computing device to perform a method comprising:
   determining calibration data comprising a plurality of calibration positions including position of a calibration field in a first direction at the plurality of calibration positions in a second and third direction relative to the position of the calibration field, wherein the calibration data is measured using only a single level sensor;
   determining production data by establishing position of the target field on the substrate of the target field in the second and third direction;

measuring position of the target field in the first direction at at least one measurement position relative to position of the target field in the second and third direction;
comparing the at least one measurement position and the plurality of calibration positions;
determining a first set of exposure settings based on the calibration data, wherein the calibration data relates to at least one of the plurality of calibration positions;
determining a second set of exposure settings based on the measured position of the target field; and
correcting the second set of exposure settings based on the comparing and the first set of exposure settings to determine the exposure settings.

* * * * *

UNITED STATES PATENT AND TRADEMARK OFFICE
CERTIFICATE OF CORRECTION

| | | |
|---|---|---|
| PATENT NO. | : 8,208,118 B2 | Page 1 of 1 |
| APPLICATION NO. | : 12/367191 | |
| DATED | : June 26, 2012 | |
| INVENTOR(S) | : Burry et al. | |

It is certified that error appears in the above-identified patent and that said Letters Patent is hereby corrected as shown below:

On the Title Page, Item (57), Abstract, after "in the first direction at" insert --at--

Signed and Sealed this
Twenty-first Day of August, 2012

David J. Kappos
*Director of the United States Patent and Trademark Office*